United States Patent
Chan (10) Patent No.: US 8,217,720 B2
(45) Date of Patent: Jul. 10, 2012

(54) VARIABLE-GAIN LOW NOISE AMPLIFIER

(75) Inventor: Wei-Chia Chan, Changhua County (TW)

(73) Assignee: Sunplus Technology Co., Ltd., Hsinchu (TW)

( * ) Notice: Subject to any disclaimer, the term of this patent is extended or adjusted under 35 U.S.C. 154(b) by 0 days.

(21) Appl. No.: 12/908,485

(22) Filed: Oct. 20, 2010

(65) Prior Publication Data

US 2011/0095822 A1    Apr. 28, 2011

(30) Foreign Application Priority Data

Oct. 23, 2009    (TW) ................................ 98135975 A (51) Int. Cl.
*H03F 3/45* (2006.01)

(52) U.S. Cl. ....................................................... 330/254

(58) Field of Classification Search .......... 330/252–254; 327/359

See application file for complete search history.

(56) References Cited

U.S. PATENT DOCUMENTS

| | | | |
|---|---|---|---|
| 5,874,857 A * | 2/1999 | Roth et al. ..................... | 330/254 |
| 5,896,063 A * | 4/1999 | Marsh et al. ................... | 330/254 |
| 6,046,640 A | 4/2000 | Brunner | |
| 6,100,761 A | 8/2000 | Ezell | |
| 6,480,066 B1 * | 11/2002 | Madni ........................... | 330/254 |
| 6,784,741 B1 | 8/2004 | Redman-White | |
| 6,791,414 B2 * | 9/2004 | Trodd et al. ................... | 330/254 |
| 7,492,222 B2 * | 2/2009 | Cowley et al. ................ | 330/254 |
| 7,492,224 B2 * | 2/2009 | Nishino ......................... | 330/254 |
| 2003/0214356 A1 * | 11/2003 | Cowley et al. ................ | 330/254 |
| 2009/0079500 A1 | 3/2009 | Cowley et al. | |

FOREIGN PATENT DOCUMENTS

CN      101697479    4/2010

OTHER PUBLICATIONS

Robert G. Meyer, William D. Mack; A DC to 1-GHz Differential Monolithic Variable-Gain Amplifier; IEEE Journal of Solid-State circuits, vol. 26, No. 11, Nov. 1991.pp. 1673-1680.
Intellectual Property Office, "Office Action", Feb. 11, 2011, United Kingdom.

* cited by examiner

*Primary Examiner* — Khanh V Nguyen
(74) *Attorney, Agent, or Firm* — WPAT, P.C.; Justin King (57) ABSTRACT

A highly linear variable-gain low noise amplifier is a cascode amplifier. The cascode amplifier includes a gain control circuit, a load circuit, a current steering circuit and an input circuit. The gain control circuit is used for receiving a gain adjusting voltage, thereby generating a resistance adjusting signal and a current steering control signal. The load circuit includes plural variable resistors. The resistances of the variable resistors are adjusted according to the resistance adjusting signal. The current steering circuit is connected to the load circuit through plural current paths for adjusting a current ratio between the plural current paths according to the current steering control signal. The current steering circuit has differential signal output terminals. The input circuit is connected to the current steering circuit. The input circuit has differential signal input terminals.

15 Claims, 10 Drawing Sheets

VARIABLE-GAIN LOW NOISE AMPLIFIER

This application claims the benefit of Taiwan application Serial No. 098135975, filed Oct. 23, 2009, the subject matter of which is incorporated herein by reference.

FIELD OF THE INVENTION

The present invention relates to a variable-gain low noise amplifier, and more particularly to a highly linear variable-gain low noise amplifier applied to a TV tuner or other broadband communication systems in order to provide low noise figure at the low gain value.

BACKGROUND OF THE INVENTION

In the broadband communication system such as a TV tuner, a highly linear variable-gain low noise amplifier is arranged in upstream of a mixer. Generally, the highly linear variable-gain low noise amplifier is implemented according to a current steering topology.

Figure 1A:
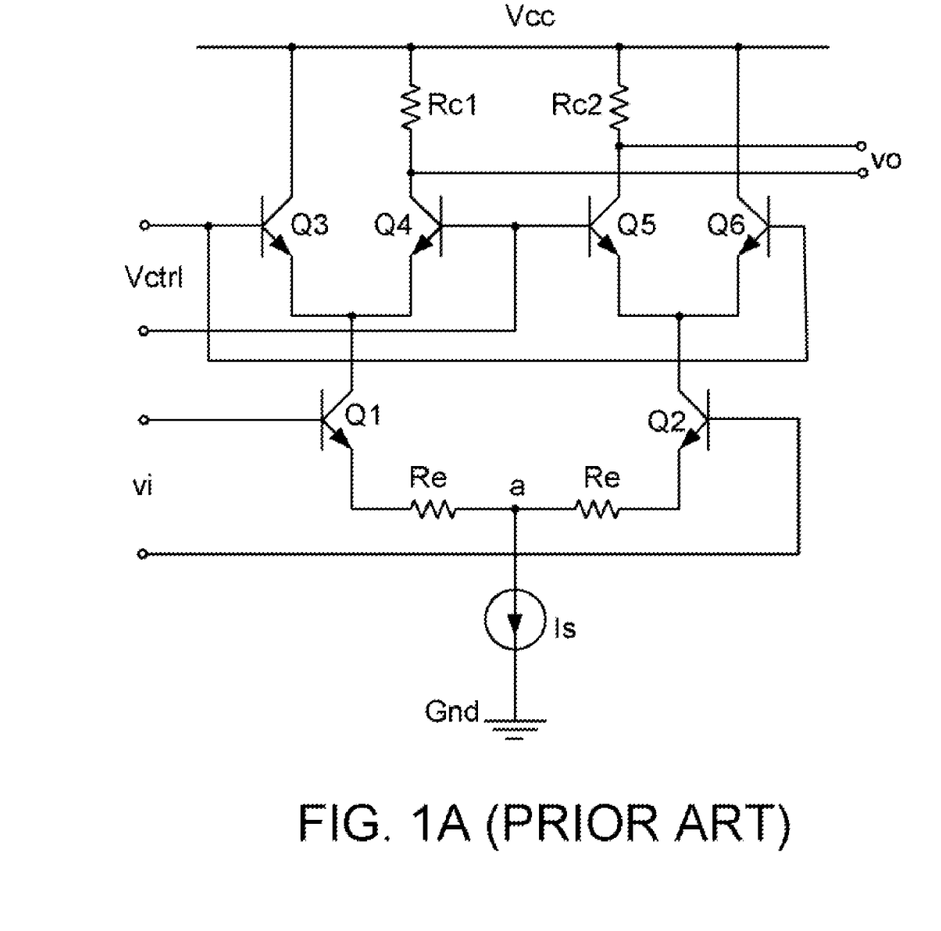
FIG. 1A is a schematic circuit diagram illustrating a conventional highly linear variable-gain amplifier.

FIG. 1A is a schematic circuit diagram illustrating a conventional highly linear variable-gain amplifier. This highly linear variable-gain amplifier is disclosed in IEEE J. Solid-State Circuits, vol. 26, pp. 1673-1680, November 1991. As shown in FIG. 1A, a first transistor Q1 and a second transistor Q2 are connected with each other to define a differential pair. The bases of the first transistor Q1 and the second transistor Q2 serve as the differential signal input terminals of the amplifier to receive an input signal vi. The first terminals of two emitter resistors Re are respectively connected to the emitters of the first transistor Q1 and the second transistor Q2. The second terminals of the two emitter resistors Re are collectively connected to a node "a". A current source (Is) is interconnected between the node "a" and a ground terminal Gnd.

The bases of a third transistor Q3 and a fourth transistor Q4 serve as the gain control terminals of the amplifier for receiving a current steering control signal Vctrl. The collector of the third transistor Q3 is connected to a voltage source Vcc. The emitter of the third transistor Q3 is connected to the collector of the first transistor Q1. A first collector resistor Rc1 is interconnected between the voltage source Vcc and the collector of the fourth transistor Q4. The emitter of the fourth transistor Q4 is connected to the collector of the first transistor Q1. The base of a fifth transistor Q5 is connected to the base of the fourth transistor Q4. The base of a sixth transistor Q6 is connected to the base of the third transistor Q3. The collector of the sixth transistor Q6 is connected to the voltage source Vcc. The emitter of the sixth transistor Q6 is connected to the collector of the second transistor Q2. A second collector resistor Rc2 is interconnected between the collector of the fifth transistor Q5 and the voltage source Vcc. The emitter of the fifth transistor Q5 is connected to the collector of the second transistor Q2. The collectors of the fourth transistor Q4 and the fifth transistor Q5 serve as differential signal output terminals of the amplifier for generating an output signal vo.

The current source (Is) may provide DC bias voltages to all transistors of the amplifier. The two emitter resistors Re may offer good linearity of the amplifier. In addition, the resistance of the first collector resistor Rc1 is identical to that of the second collector resistor Rc2.

In response to a change of the current steering control signal Vctrl, the bias currents flowing through the third transistor Q3, the fourth transistor Q4, the fifth transistor Q5 and the sixth transistor Q6 are varied, and thus the gain value of the amplifier are adjustable. Moreover, the above amplifier may acquire a high gain control range.

Figure 1B:
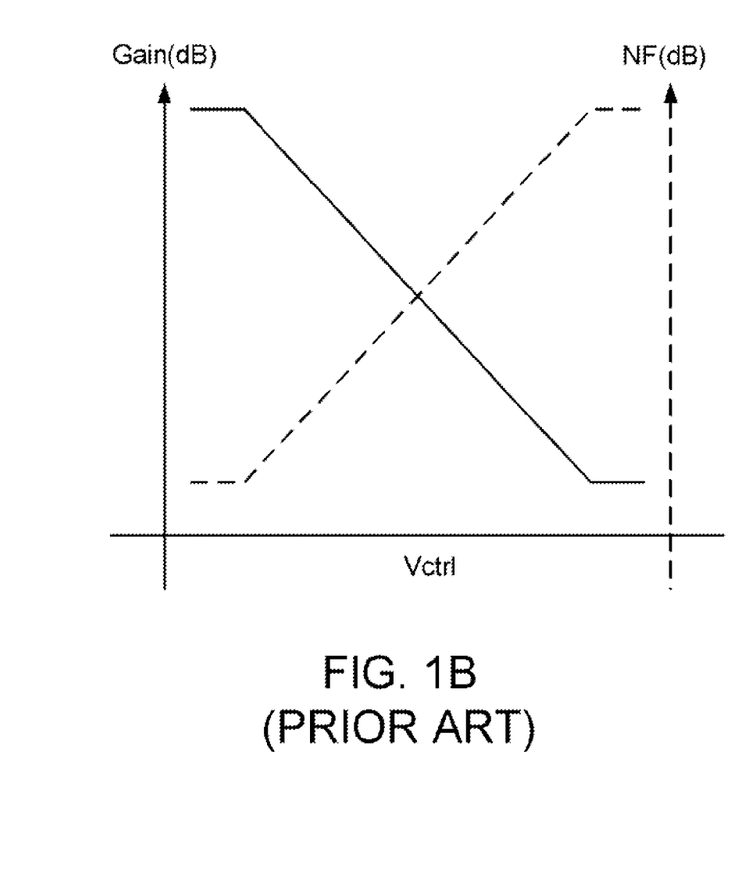
FIGS. 1B and 1C are schematic diagrams illustrating the relationship between the gain and the noise figure (NF) of the conventional highly linear variable-gain amplifier.
Figure 1C:
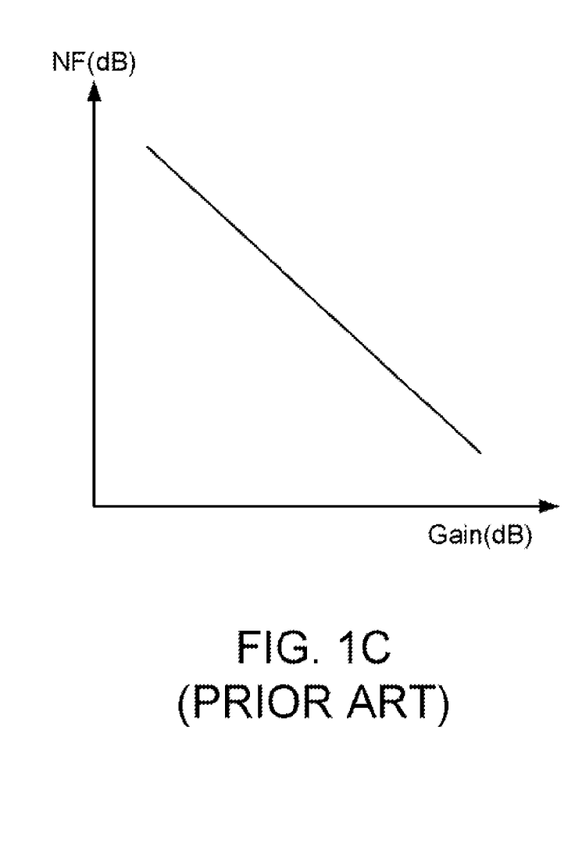

Generally, the noise figure (NF) of the highly linear variable-gain amplifier is varied with the gain value. FIGS. 1B and 1C are schematic diagrams illustrating the relationship between the gain and the noise figure (NF) of the conventional highly linear variable-gain amplifier. As can be seen from FIGS. 1B and 1C, as the gain value of the amplifier is increased, the noise figure is decreased. Whereas, as the gain value of the amplifier is decreased, the noise figure is increased. That, when the gain value of the amplifier is adjusted according to the current steering control signal Vctrl, the noise figure is increased at nearly the same rate as the gain value is decreased.

In a case that the magnitude of the input signal vi is very low, the gain value of the amplifier is usually adjusted to the maximum value, and thus the noise figure is not too large. In a case that the magnitude of the input signal vi is relatively larger, the gain value needs to be reduced. In this situation, the noise figure of the amplifier is increased, and the signal is also amplified. In other words, the magnitude of the output signal vo allows for providing a sufficient signal-to-noise ratio (SNR). However, in the broadband communication application, the interference and noise are sometimes greater than the useful signal. For preventing the electronic components of the amplifier from entering the saturation region, the gain value of the amplifier needs to be decreased. If the increase of the noise figure is too obvious, however, the magnitude of the output signal vo fails to provide a sufficient signal-to-noise ratio (SNR), and thus the baseband circuit fails to effectively restore the signal. That is, when the amplifier has a low gain, low noise figure (NF) is very critical.

Figure 2:
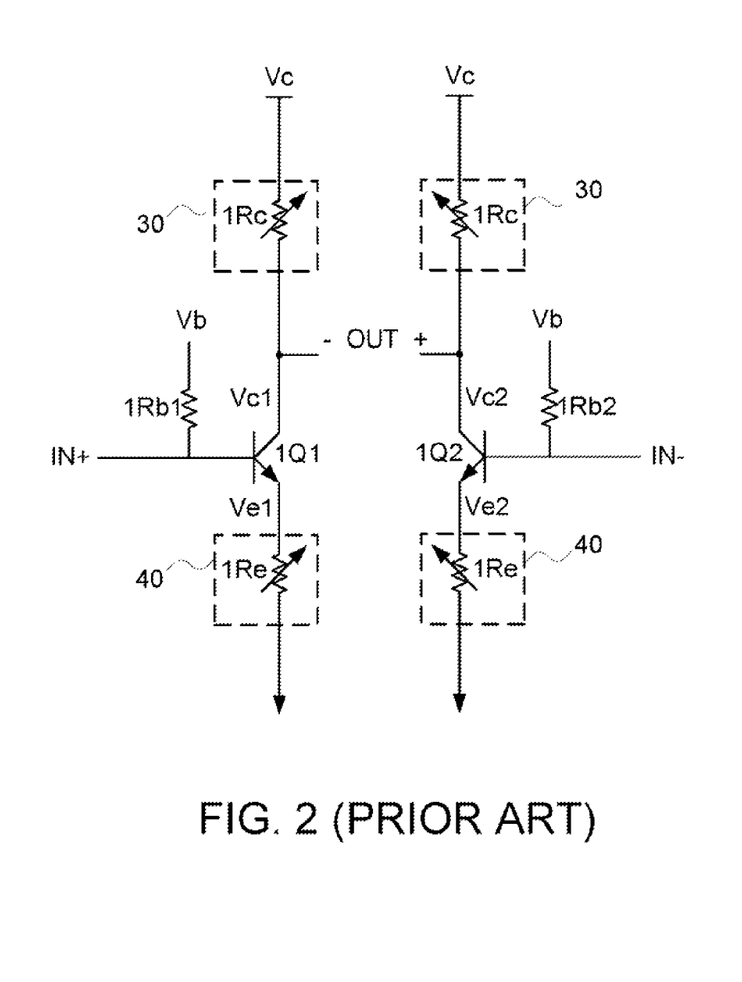
FIG. 2 is a schematic circuit diagram illustrating another conventional highly linear variable-gain low noise amplifier.

FIG. 2 is a schematic circuit diagram illustrating another conventional highly linear variable-gain low noise amplifier. The highly linear variable-gain low noise amplifier is disclosed in for example U.S. Pat. No. 6,100,761. As shown in FIG. 2, a first transistor 1Q1 and a second transistor 1Q2 are connected with each other to define a differential pair. The base of the first transistor 1Q1 is connected with a base voltage Vb through a first base resistor 1Rb1. The base of the second transistor 1Q2 is connected with the base voltage Vb through a second base resistor 1Rb2. The bases of the first transistor Q1 and the second transistor Q2 serve as the differential signal input terminals (IN+ and IN−) of the amplifier.

The first terminals of two variable emitter resistors (1Re) 40 are respectively connected to the emitters of the first transistor 1Q1 and the second transistor 1Q2. The second terminals of two variable collector resistors (1Rc) 30 are respectively connected to a collector voltage Vc. Moreover, the collectors of the first transistor Q1 and the second transistor Q2 serve as the differential signal output terminals (− OUT +) of the amplifier.

In the amplifier of FIG. 2, the gain value of the amplifier is adjusted by changing the resistances of the variable emitter resistors (1Re) 40 and the variable collector resistors (1Rc) 30. The changes of the variable emitter resistors (1Re) 40, however, may deteriorate the linearity of the amplifier.

SUMMARY OF THE INVENTION

The present invention provides a highly linear variable-gain low noise amplifier to provide low noise figure at the low gain value.

In accordance with an aspect of the present invention, there is provided a cascode amplifier. The cascode amplifier includes a gain control circuit, a load circuit, a current steering circuit and an input circuit. The gain control circuit is used for receiving a gain adjusting voltage, thereby generating a resistance adjusting signal and a current steering control signal. When the gain adjusting voltage is in a high gain-adjusting range, the resistance adjusting signal is adjusted but the current steering control signal is kept unchanged. Whereas, when the gain adjusting voltage is in a low gain-adjusting range, the current steering control signal is adjusted but the resistance adjusting signal is kept unchanged. The load circuit includes plural variable resistors. The resistances of the variable resistors are adjusted according to the resistance adjusting signal. The current steering circuit is connected to the load circuit through plural current paths for adjusting a current ratio between the plural current paths according to the current steering control signal. The current steering circuit has differential signal output terminals. The input circuit is connected to the current steering circuit. The input circuit has differential signal input terminals.

In accordance with another aspect of the present invention, there is provided a cascode amplifier. The cascode amplifier includes a first bipolar junction transistor, a second bipolar junction transistor, two emitter resistors, a first current source, a first variable resistor, a first n-type field effect transistor, a second n-type field effect transistor, a second variable resistor, a third n-type field effect transistor, a fourth n-type field effect transistor, and a gain control circuit. The bases of the first bipolar junction transistor and the second bipolar junction transistor serve as differential signal input terminals. The first terminals of the emitter resistors are respectively connected to the emitters of the first bipolar junction transistor and the second bipolar junction transistor. The second terminals of the emitter resistors are connected to a first node. The first current source is interconnected between the first node and a ground terminal. The gate terminal of the first n-type field effect transistor receives a gate voltage. The source terminal of the first n-type field effect transistor is connected to the collector of the first bipolar junction transistor. The first variable resistor is interconnected between a voltage source and the drain terminal of the first n-type field effect transistor. The gate terminal of the second n-type field effect transistor receives a current steering control signal. The source terminal of the second n-type field effect transistor is connected to the collector of the first bipolar junction transistor. The drain terminal of the second n-type field effect transistor is connected to the voltage source. The gate terminal of the third n-type field effect transistor receives the current steering control signal. The source terminal of the third n-type field effect transistor is connected to the collector of the second bipolar junction transistor. The drain terminal of the third n-type field effect transistor is connected to the voltage source. The gate terminal of the fourth n-type field effect transistor receives the gate voltage. The source terminal of the fourth n-type field effect transistor is connected to the collector of the second bipolar junction transistor. The second variable resistor is interconnected between the drain terminal of the fourth n-type field effect transistor and the voltage source. The gain control circuit is used for receiving a gain adjusting voltage, thereby generating the current steering control signal and resistance adjusting signal. The first variable resistor and the second variable resistor are adjusted according to the resistance adjusting signal. The drain terminals of the first n-type field effect transistor and the fourth n-type field effect transistor serve as differential signal output terminals.

BRIEF DESCRIPTION OF THE DRAWINGS

The above contents of the present invention will become more readily apparent to those ordinarily skilled in the art after reviewing the following detailed description and accompanying drawings, in which.

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 3A:
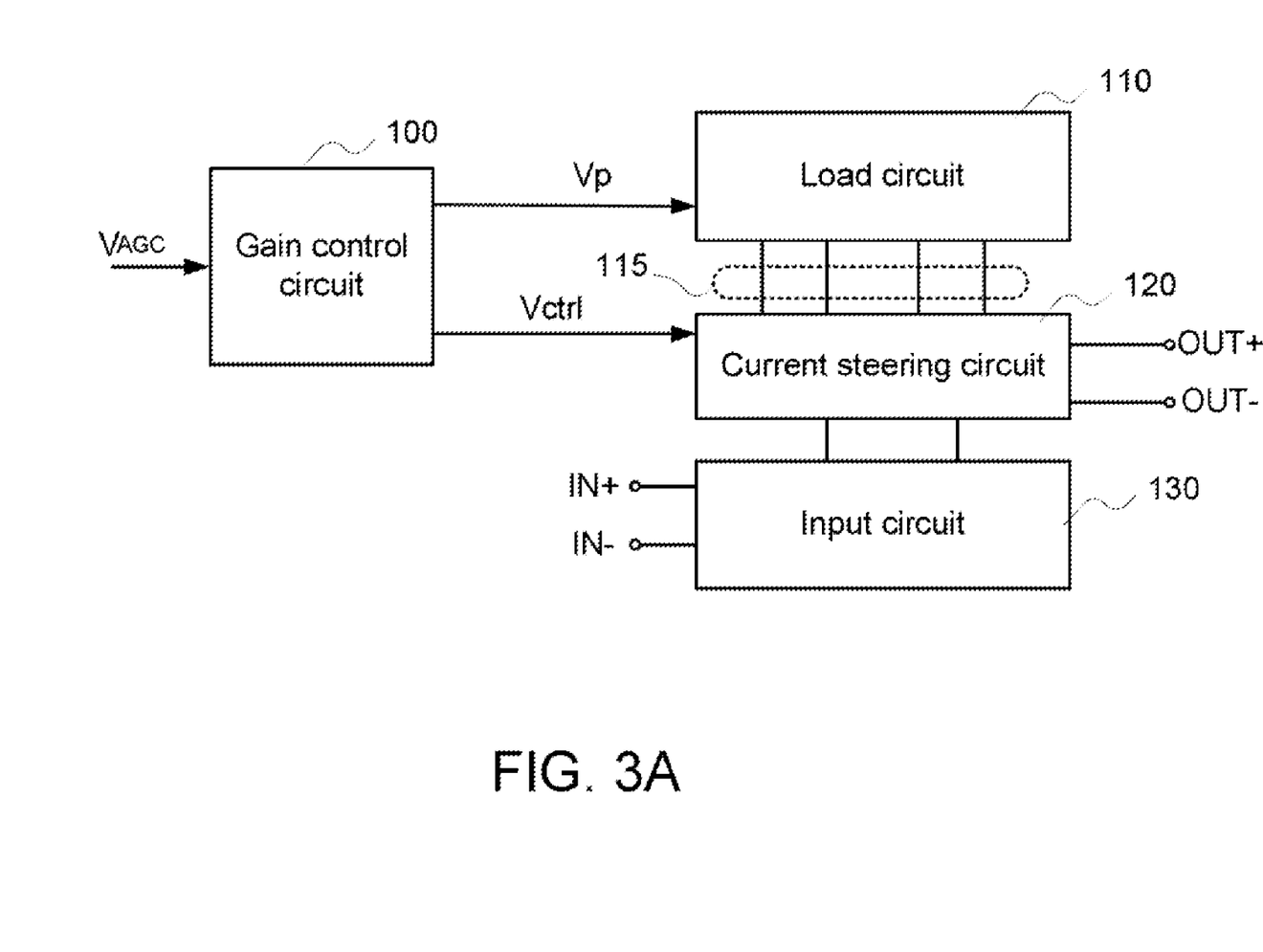
FIG. 3A is a schematic functional block diagram illustrating a highly linear variable-gain low noise amplifier according to an embodiment of the present invention.

FIG. 3A is a schematic functional block diagram illustrating a highly linear variable-gain low noise amplifier according to an embodiment of the present invention. As shown in FIG. 3A, the amplifier comprises a gain control circuit 100, a load circuit 110, a current steering circuit 120 and an input circuit 130. The load circuit 110, the current steering circuit 120 and the input circuit 130 are connected with each other to define a cascode amplifier. The gain control circuit 100 is used for receiving a gain adjusting voltage VAGC, thereby generating a resistance adjusting signal Vp and a current steering control signal Vctrl. According to the resistance adjusting signal Vp, the resistance of a variable resistor of the load circuit 110 is adjusted. The current steering circuit 120 is connected to the load circuit 110 through plural current paths 115. According to the current steering control signal Vctrl, the current steering circuit 120 may adjust a current ratio between the plural current paths 115. In addition, the current steering circuit 120 has two differential signal output terminals (OUT+, OUT−). The input circuit 130 is connected to the current steering circuit 120. In addition, the input circuit 130 has two differential signal input terminals (IN+, IN−).

In accordance with the present invention, the amplifier has two gain-adjusting ranges, i.e. a high gain-adjusting range and a low gain-adjusting range. In the high gain-adjusting range, the resistance of the variable resistor is varied as the resistance adjusting signal Vp is changed. On the other hand, in the low gain-adjusting range, the current ratio between the plural current paths is varied as the current steering control signal Vctrl is changed.

Figure 3B:
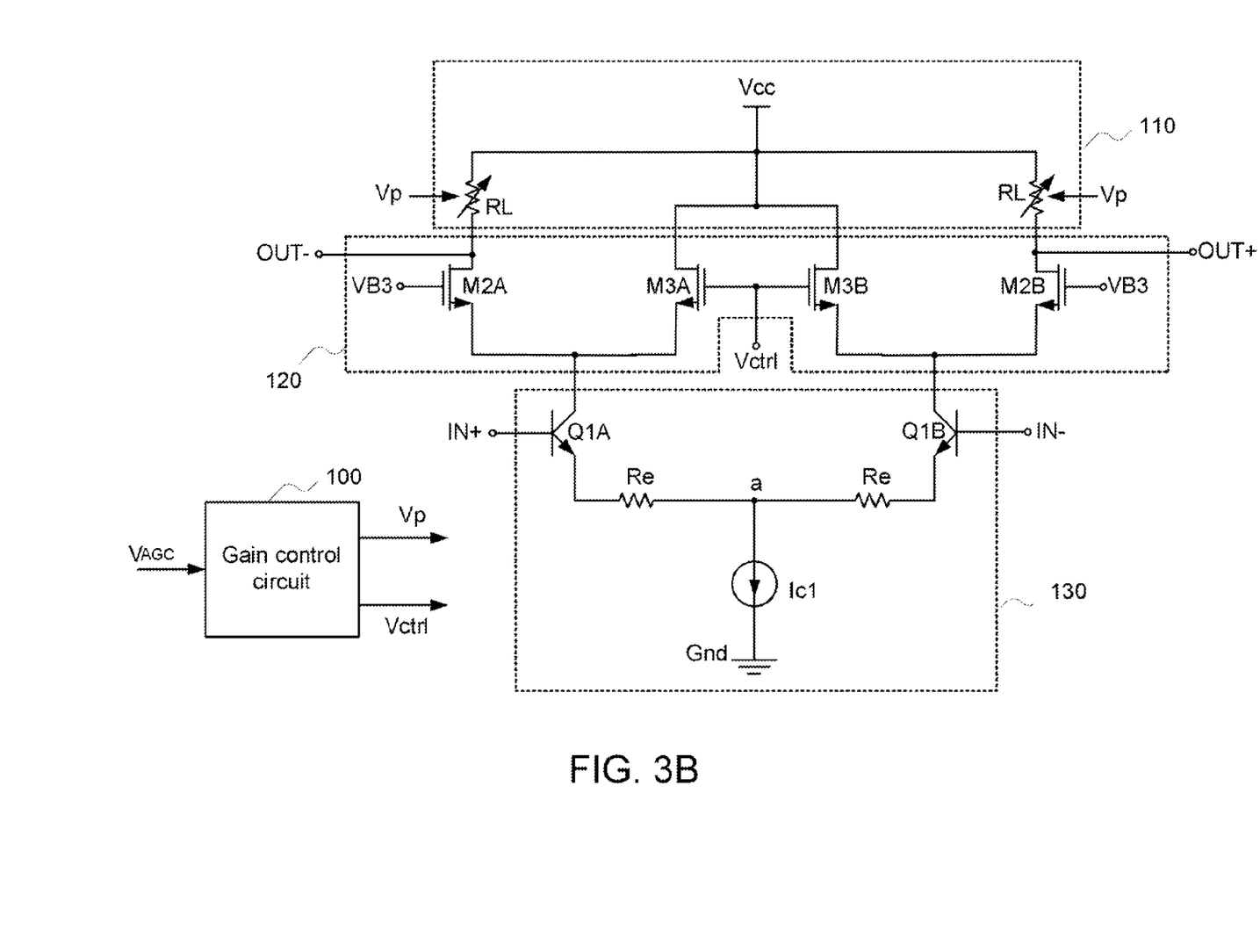
FIG. 3B is a schematic circuit diagram illustrating a highly linear variable-gain low noise amplifier according to a first embodiment of the present invention.

FIG. 3B is a schematic circuit diagram illustrating a highly linear variable-gain low noise amplifier according to a first embodiment of the present invention. The input circuit 130 comprises a first bipolar junction transistor (BJT) Q1A, a second bipolar junction transistor Q1B, two emitter resistors Re and a first current source Ic1. The first bipolar junction transistor Q1A and the second bipolar junction transistor Q1B are connected with each other to define a differential pair. The bases of the first bipolar junction transistor Q1A and the second bipolar junction transistor Q1B are used as the differential signal input terminals (IN+, IN−) of the amplifier. The first terminal of the two emitter resistors Re are respectively connected to the emitters of the first bipolar junction transistor Q1A and the second bipolar junction transistor Q1B. The second terminals of the two emitter resistors Re are collectively connected to a node "a". The first current source (Ic1) is interconnected between the node "a" and a ground terminal Gnd.

The load circuit 110 comprises two variable resistors RL. The current steering circuit 120 comprises a first n-type field effect transistor (FET) M2A, a second n-type field effect transistor M3A, a third n-type field effect transistor M3B and a fourth n-type field effect transistor M2B.

The gate terminal of the first n-type field effect transistor M2A receives a gate voltage VB3. The source terminal of the first n-type field effect transistor M2A is connected to the collector of the first bipolar junction transistor Q1A. A variable resistor RL is interconnected between the drain terminal of the first n-type field effect transistor M2A and a voltage source Vcc. The gate terminal of the second n-type field effect transistor M3A receives a current steering control signal Vctrl. The source terminal of the second n-type field effect transistor M3A is connected to the collector of the first bipolar junction transistor Q1A. The drain terminal of the second n-type field effect transistor M3A is connected to the voltage source Vcc.

The gate terminal of the third n-type field effect transistor M3B receives the current steering control signal Vctrl. The source terminal of the third n-type field effect transistor M3B is connected to the collector of the second bipolar junction transistor Q1B. The drain terminal of the third n-type field effect transistor M3B is connected to the voltage source Vcc. The gate terminal of the fourth n-type field effect transistor M2B receives a gate voltage VB3. The source terminal of the fourth n-type field effect transistor M2B is connected to the collector of the second bipolar junction transistor Q1B. Another variable resistor RL is interconnected between the drain terminal of the fourth n-type field effect transistor M2B and the voltage source Vcc. The drain terminals of the first n-type field effect transistor M2A and the fourth n-type field effect transistor M2B are used as the differential signal output terminals (OUT+, OUT−).

The gain control circuit 100 is used for receiving the gain adjusting voltage VAGC, thereby generating the resistance adjusting signal Vp and the current steering control signal Vctrl. According to the resistance adjusting signal Vp, the resistances of the variable resistors RL are adjustable.

In this embodiment, the first bipolar junction transistor Q1A and the second bipolar junction transistor Q1B have the same layout area; the first n-type field effect transistor M2A and the fourth n-type field effect transistor M2B have the same size; and the second n-type field effect transistor M3A and the third n-type field effect transistor M3B have the same size. The first current source Ic1 may provide DC bias voltages to all transistors of the amplifier. As a consequence, the amplifier may be operated at a proper quiescent point.

Figure 3C:
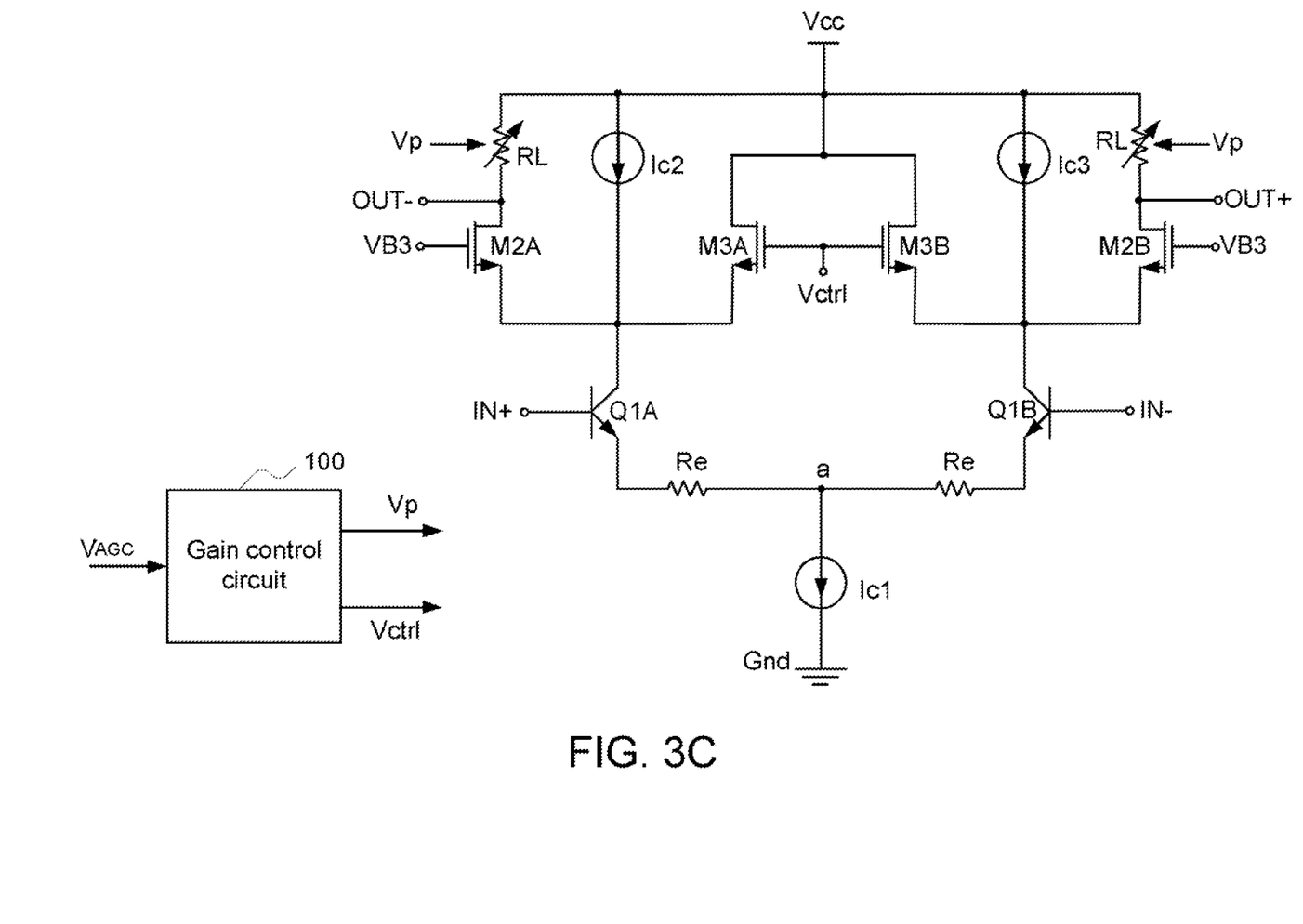
FIG. 3C is a schematic circuit diagram illustrating a highly linear variable-gain low noise amplifier according to a second embodiment of the present invention.

FIG. 3C is a schematic circuit diagram illustrating a highly linear variable-gain low noise amplifier according to a second embodiment of the present invention. In comparison with FIG. 3B, the amplifier of FIG. 3C further comprises a second current source Ic2 and a third current source Ic3. The second current source Ic2 is interconnected between the voltage source Vcc and the collector of the first bipolar junction transistor Q1A. The third current source Ic3 is interconnected between the voltage source Vcc and the collector of the second bipolar junction transistor Q1B. The first current source Ic1, the second current source Ic2 and the third current source Ic3 may provide DC bias voltages to all transistors of the amplifier. As a consequence, the amplifier may be operated at a proper quiescent point. Moreover, the small signal model of the amplifier is not influenced by the first current source Ic1, the second current source Ic2 and the third current source Ic3.

From FIGS. 3B and 3C, the voltage gain Av may be deduced by the following formula:

$$Av = \frac{(OUT+) - (OUT-)}{(IN+) - (IN-)} = \left(\frac{RL}{1/g_{m1} + Re}\right)\left(\frac{g_{m2}}{g_{m2} + g_{m3}}\right),$$

where, gm1 is a trans-conductance parameter of the first bipolar junction transistor Q1A and the second bipolar junction transistor Q1B, gm2 is a trans-conductance parameter of the first n-type field effect transistor M2A and the fourth n-type field effect transistor M2B, and gm3 is a trans-conductance parameter of the second n-type field effect transistor M3A and the third n-type field effect transistor M3B.

In this embodiment, the amplifier has two gain-adjusting ranges, i.e. a high gain-adjusting range and a low gain-adjusting range. In the high gain-adjusting range, the gain value of the amplifier is adjusted by changing the resistance of the variable resistor RL. In the low gain-adjusting range, the amplifier is implemented according to a current steering topology. That is, the gain value of the amplifier is adjusted by changing the current steering control signal Vctrl and the trans-conductance parameters for the n-type field effect transistors (gm2 and gm3).

The principle of varying the gain value from the largest value to the smallest value in the gain-adjusting range will be illustrated as follows. When the gain adjusting voltage VAGC is in the high gain-adjusting range, the resistance adjusting signal Vp is changed by the gain control circuit 100 but the current steering control signal Vctrl is kept unchanged. As such, the resistance of the variable resistor RL is decreased. On the other hand, when the gain adjusting voltage VAGC is in the low gain-adjusting range, the resistance adjusting signal Vp is kept unchanged but the current steering control signal Vctrl is changed by the gain control circuit 100. As such, the resistance of the variable resistor RL is kept unchanged, the trans-conductance parameter gm3 is gradually increased, and the trans-conductance parameter gm2 is gradually decreased.

Figure 4A:
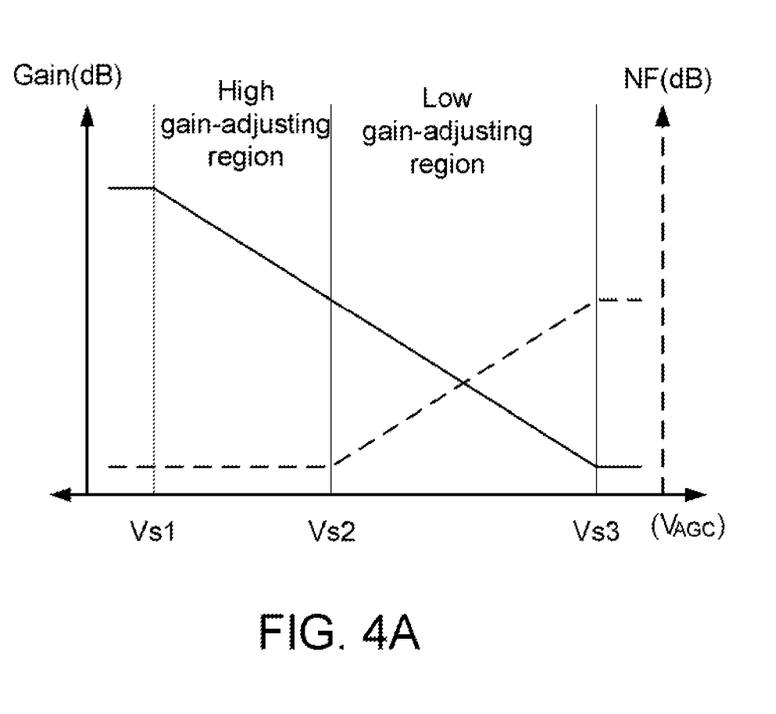
FIGS. 4A and 4B are schematic diagrams illustrating the relationship between the gain and the noise figure (NF) of the amplifier of the present invention.
Figure 4B:
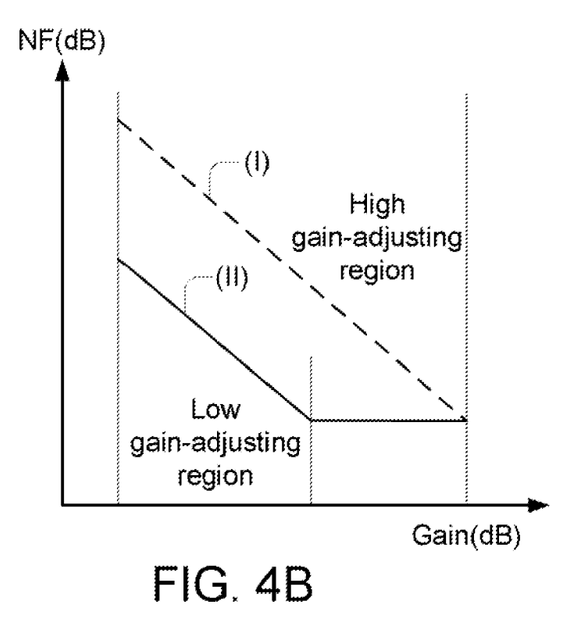

FIGS. 4A and 4B are schematic diagrams illustrating the relationship between the gain and the noise figure (NF) of the amplifier of the present invention. As shown in FIG. 4A, as the gain adjusting voltage VAGC is increased from Vs1 to Vs2 in the high gain-adjusting range (i.e. the resistance of the variable resistor RL is adjustable), the noise figure (NF) is nearly unchanged. That is, in the high gain-adjusting range, the noise figure (NF) is not increased as the gain value is decreased.

Moreover, as the gain adjusting voltage VAGC is increased from Vs2 to Vs3 in the low gain-adjusting range, the gain value is adjusted according to the current steering control signal Vctrl. That is, the noise figure (NF) is increased as the gain value is decreased.

In FIG. 4B, the relationship between the gain and the noise figure (NF) of the conventional amplifier is shown in the curve (I), and the relationship between the gain and the noise figure (NF) of the amplifier of the present invention is shown in the curve (II). As the gain value is decreased to the lowest value, the noise figure (NF) of the amplifier of the present invention is much lower than that of the conventional amplifier.

Figure 5A:
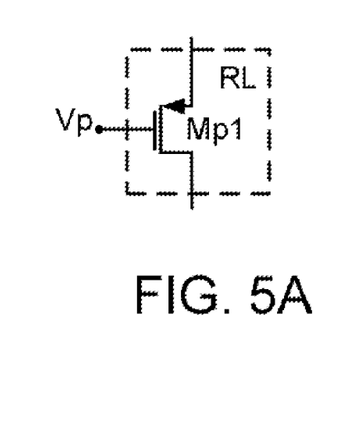
FIGS. 5A, 5B and 5C are schematic circuit diagrams illustrating three exemplary variable resistors RL used in the amplifier of the present invention.
Figure 5B:
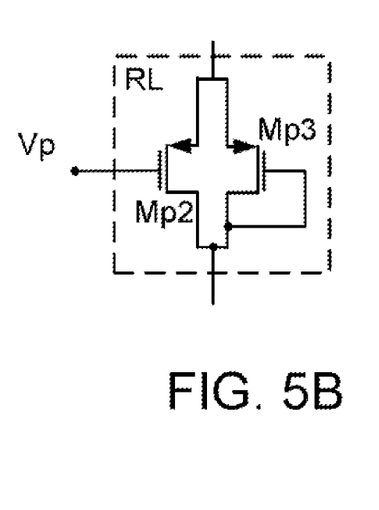
Figure 5C:
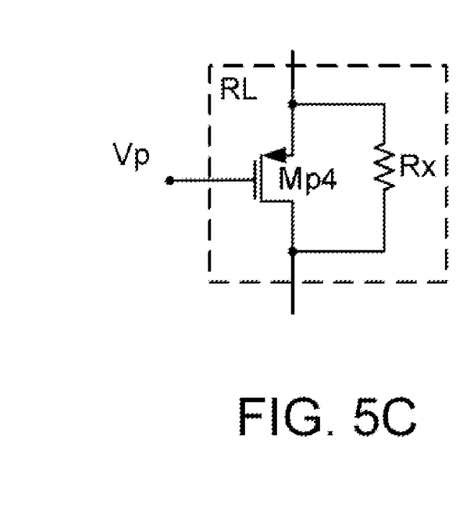

FIGS. 5A, 5B and 5C are schematic circuit diagrams illustrating three exemplary variable resistors RL used in the amplifier of the present invention.

As shown in FIG. 5A, the variable resistor RL includes a first p-type field effect transistor Mp1. The gate terminal of the first p-type field effect transistor Mp1 receives the resistance adjusting signal Vp. The source terminal and the drain terminal of the resistance adjusting signal Vp are used as both terminals of the variable resistor RL.

As shown in FIG. 5B, the variable resistor RL includes a second p-type field effect transistor Mp2 and a third p-type field effect transistor Mp3. The gate terminal of the second p-type field effect transistor Mp2 receives the resistance adjusting signal Vp. The source terminal and the drain terminal of the second p-type field effect transistor Mp2 are used as both terminals of the variable resistor RL. The source terminal of the third p-type field effect transistor Mp3 is connected to the source terminal of the second p-type field effect transistor Mp2. The drain terminal of the third p-type field effect transistor Mp3 is connected to the drain terminal of the second p-type field effect transistor Mp2. In addition, the drain terminal and the gate terminal of the third p-type field effect transistor Mp3 are connected with each other to define a diode-connected transistor.

As shown in FIG. 5C, the variable resistor RL includes a fourth p-type field effect transistor Mp4 and a polysilicon resistor Rx. The gate terminal of the fourth p-type field effect transistor Mp4 receives the resistance adjusting signal Vp. The source terminal and the drain terminal of the fourth p-type field effect transistor Mp4 are used as both terminals of the variable resistor RL. In addition, both terminals of the polysilicon resistor Rx are respectively connected to the source terminal and the drain terminal of the fourth p-type field effect transistor Mp4.

Figure 6A:
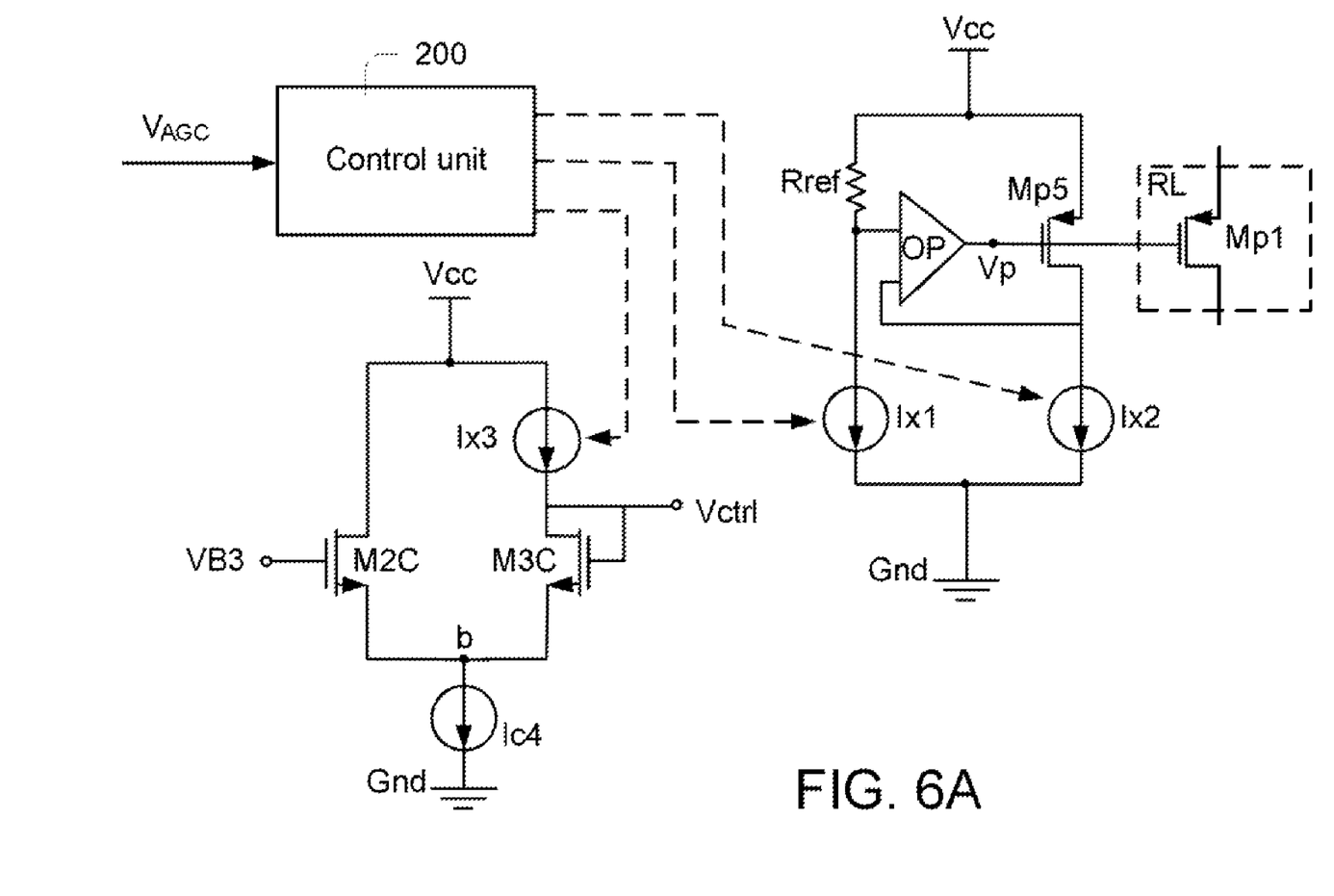
FIG. 6A is a schematic diagram illustrating an exemplary gain control circuit of the present invention.

FIG. 6A is a schematic diagram illustrating an exemplary gain control circuit of the present invention. As shown in FIG. 6, the gain control circuit comprises a controlling unit 200, a resistance adjusting circuit and a current steering control circuit. In this embodiment, the variable resistor RL is illustrated by referring to the first p-type field effect transistor Mp1 as shown in FIG. 5A.

The resistance adjusting circuit comprises a reference resistor Rref, a first variable current source Ix1, a fifth p-type field effect transistor Mp5, and a second variable current source Ix2. The reference resistor Rref is interconnected between the voltage source Vcc and a first input terminal of an operation amplifier OP. The first variable current source Ix1 is interconnected between the first input terminal of the operation amplifier OP and a ground terminal Gnd. The source terminal of the fifth p-type field effect transistor Mp5 is connected to the voltage source Vcc. The gate terminal of the fifth p-type field effect transistor Mp5 is connected to the output terminal of the operation amplifier OP. The drain terminal of the fifth p-type field effect transistor Mp5 is connected to a second input terminal of the operation amplifier OP. The second variable current source Ix2 is interconnected between the second input terminal of the operation amplifier OP and the ground terminal Gnd. The resistance adjusting signal Vp is outputted from the output terminal of the operation amplifier OP. The sizes of the fifth p-type field effect transistor Mp5 and the first p-type field effect transistor Mp1 correspond to each other.

The current steering control circuit comprises a fifth n-type field effect transistor M2C, a sixth n-type field effect transistor M3C, a third variable current source Ix3, and a fourth current source Ic4. The drain terminal of the fifth n-type field effect transistor M2C is connected to the voltage source Vcc. The gate terminal of the fifth n-type field effect transistor M2C receives the gate voltage VB3. The source terminal of the fifth n-type field effect transistor M2C is connected to a node "b". The drain terminal and the gate terminal of the sixth n-type field effect transistor M3C are connected to each other, and generate the current steering control signal Vctrl. The source terminal of the sixth n-type field effect transistor M3C is connected to the node "b". The third variable current source Ix3 is interconnected between the voltage source Vcc and the drain terminal of the sixth n-type field effect transistor M3C. The fourth current source Ic4 is interconnected between the node "b" and the ground terminal Gnd.

The fifth n-type field effect transistor M2C, the sizes of the first n-type field effect transistor M2A and the fourth n-type field effect transistor M2B correspond to each other. The sixth n-type field effect transistor M3C, the second n-type field effect transistor M3A and the third n-type field effect transistor M3B correspond to each other.

Moreover, the controlling unit 200 may receive the gain adjusting voltage VAGC, and control the first variable current source Ix1, the second variable current source Ix2 and the third variable current source Ix3.

During normal operations of the resistance adjusting circuit, if the gain value of the operation amplifier OP is sufficiently high, the magnitudes of the voltages inputted into the two input terminals are equal. In this situation, the following equation is deduced:

$$Rmp5 = \frac{Ix1}{Ix2} \cdot Rref.$$

That is, according to the resistance adjusting signal Vp outputted from the operation amplifier OP, the equivalent resistance of the fifth p-type field effect transistor Mp5 is Rmp5. Since the resistance adjusting signal Vp is also inputted into the gate terminal of the first p-type field effect transistor Mp1, the resistance of the variable resistor RL is also equal to Rmp5. By adjusting the current ratio of the first variable current source Ix1 to the second variable current source Ix2, the resistance adjusting signal Vp is changed. As a consequence, the resistance of the variable resistor RL is correspondingly changed.

Figure 6B:
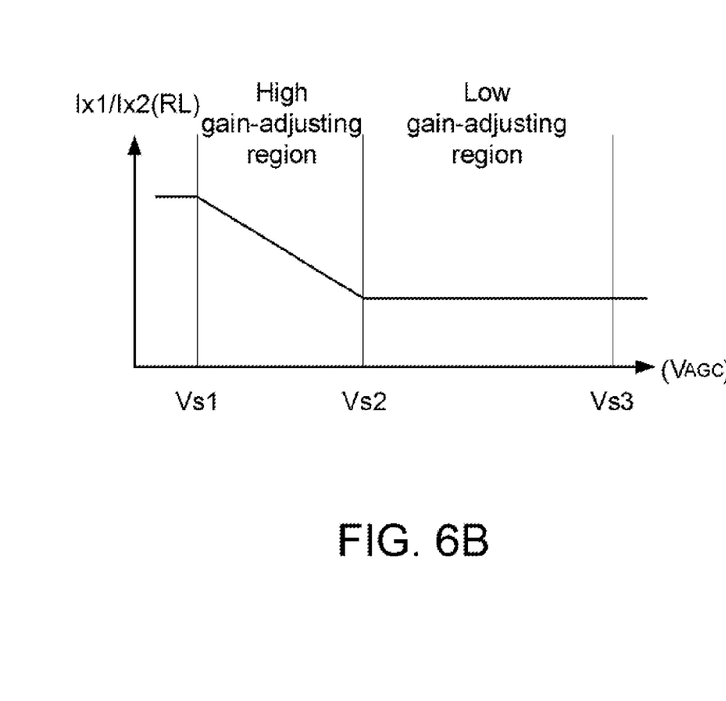
FIG. 6B is a schematic diagram illustrating adjustment of the gain control circuit in the high gain-adjusting range.

FIG. 6B is a schematic diagram illustrating adjustment of the gain control circuit in the high gain-adjusting range. As the gain adjusting voltage VAGC is increased from Vs1 to Vs2, the current ratio between the first variable current source Ix1 and the second variable current source Ix2 is changed by the gain control circuit, and the third variable current source Ix3 is 0. As such, the current ratio is equal to Ix1/Ix2. When the gain adjusting voltage VAGC is equal to Vs2, the current ratio (Ix1/Ix2) has a minimum value, which is then kept unchanged. In other words, as the current ratio (Ix1/Ix2) is gradually decreased, the resistance of the variable resistor is gradually decreased.

Figure 6C:
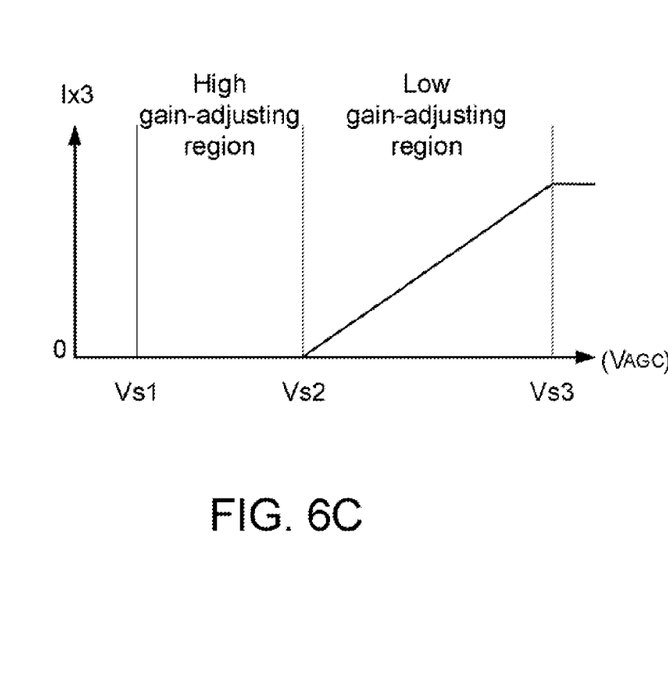
FIG. 6C is a schematic diagram illustrating adjustment of the gain control circuit in the low gain-adjusting range.

FIG. 6C is a schematic diagram illustrating adjustment of the gain control circuit in the low gain-adjusting range. As the gain adjusting voltage VAGC is increased from Vs2 to Vs3, the third variable current source Ix3 is gradually increased. That is, the current flowing through the sixth n-type field effect transistor M3C (i.e. Ix3) is gradually increased, but the current flowing through the fifth n-type field effect transistor M2C (i.e. Ic4-Ix3) is gradually decreased. In this situation, the magnitude of the current steering control signal Vctrl is gradually increased, the trans-conductance parameter gm3 is gradually increased, and the trans-conductance parameter gm2 is gradually decreased.

In the above embodiments, the gain value is adjusted from the largest value to the smallest value in the gain-adjusting range (i.e. the gain adjusting voltage VAGC is changed from Vs1 to Vs3). In the high gain-adjusting range, the gain value of the amplifier is reduced by decreasing the resistance of the variable resistor RL. In the low gain-adjusting range, the gain value of the amplifier is reduced by increasing the conductance parameter gm3 and decreasing the trans-conductance parameter gm2.

In the above embodiments, the first bipolar junction transistor Q1A and the second bipolar junction transistor Q1B are connected with each other to define the differential pair. However, those skilled in the art will readily observe that numerous modifications and alterations of may be made while retaining the teachings of the invention. For example, the bipolar junction transistors may be replaced by other transistors (e.g. field effect transistors).

From the above description, the present invention provides a highly linear variable-gain low noise amplifier. In the high gain-adjusting range, the gain value of the amplifier is adjusted by changing the resistance of the variable resistor RL. In the low gain-adjusting range, the gain value of the amplifier is adjusted by changing the conductance parameter gm3 and gm2. As a consequence, the amplifier of the present invention can provide low noise figure at the low gain value. In comparison with the conventional highly linear variable-gain amplifier, the highly linear variable-gain low noise amplifier of the present invention can provide a wider gain-adjusting range, thereby achieving the desired benefits such as lower power consumption, smaller layout area and lower linearity request.

While the invention has been described in terms of what is presently considered to be the most practical and preferred embodiments, it is to be understood that the invention needs not to be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A cascode amplifier comprising:
   a gain control circuit for receiving a gain adjusting voltage, thereby generating a resistance adjusting signal and a current steering control signal, wherein when the gain adjusting voltage is in a high gain-adjusting range, the resistance adjusting signal is adjusted but the current steering control signal is kept unchanged, wherein when the gain adjusting voltage is in a low gain-adjusting range, the current steering control signal is adjusted but the resistance adjusting signal is kept unchanged;
   a load circuit comprising plural variable resistors, wherein the resistances of the variable resistors are adjusted according to the resistance adjusting signal;
   a current steering circuit connected to the load circuit through plural current paths for adjusting a current ratio between the plural current paths according to the current steering control signal, wherein the current steering circuit has differential signal output terminals; and
   an input circuit connected to the current steering circuit, wherein the input circuit has differential signal input terminals.

2. The cascode amplifier according to claim 1 wherein when the gain adjusting voltage is in the high gain-adjusting range, the resistances of the variable resistors of the load circuit are adjusted according to the resistance adjusting signal, thereby decreasing a gain value of the cascode amplifier.

3. The cascode amplifier according to claim 1 wherein when the gain adjusting voltage is in the low gain-adjusting range, the current ratio between the plural current paths is adjusted according to the current steering control signal, so that trans-conductance parameters of plural transistors of the current steering circuit are changed and the gain value of the cascode amplifier is adjusted.

4. A cascode amplifier comprising:
   a first bipolar junction transistor;
   a second bipolar junction transistor, wherein the bases of the first bipolar junction transistor and the second bipolar junction transistor serve as differential signal input terminals;
   two emitter resistors, wherein first terminals of the emitter resistors are respectively connected to the emitters of the first bipolar junction transistor and the second bipolar junction transistor, second terminals of the emitter resistors are collectively connected to a first node;
   a first current source interconnected between the first node and a ground terminal;
   a first variable resistor;
   a first n-type field effect transistor, wherein the gate terminal of the first n-type field effect transistor receives a gate voltage, the source terminal of the first n-type field effect transistor is connected to the collector of the first bipolar junction transistor, and the first variable resistor is interconnected between a voltage source and the drain terminal of the first n-type field effect transistor;
   a second n-type field effect transistor, wherein the gate terminal of the second n-type field effect transistor receives a current steering control signal, the source terminal of the second n-type field effect transistor is connected to the collector of the first bipolar junction transistor, and the drain terminal of the second n-type field effect transistor is connected to the voltage source;
   a second variable resistor;
   a third n-type field effect transistor, wherein the gate terminal of the third n-type field effect transistor receives the current steering control signal, the source terminal of the third n-type field effect transistor is connected to the collector of the second bipolar junction transistor, and the drain terminal of the third n-type field effect transistor is connected to the voltage source;
   a fourth n-type field effect transistor, wherein the gate terminal of the fourth n-type field effect transistor receives the gate voltage, and the source terminal of the fourth n-type field effect transistor is connected to the collector of the second bipolar junction transistor, and the second variable resistor is interconnected between the drain terminal of the fourth n-type field effect transistor and the voltage source; and
   a gain control circuit for receiving a gain adjusting voltage, thereby generating the current steering control signal and resistance adjusting signal, wherein the first variable resistor and the second variable resistor are adjusted according to the resistance adjusting signal, wherein the drain terminals of the first n-type field effect transistor and the fourth n-type field effect transistor serve as differential signal output terminals.

5. The cascode amplifier according to claim 4 further comprising:
a second variable current source interconnected between the voltage source and the collector of the first bipolar junction transistor; and
a third variable current source interconnected between the voltage source and the collector of the second bipolar junction transistor.

6. The cascode amplifier according to claim 4 wherein the first variable resistor includes a first p-type field effect transistor, wherein the gate terminal of the first p-type field effect transistor receives the resistance adjusting signal, and the source terminal and the drain terminal of the first p-type field effect transistor are both terminals of the first variable resistor.

7. The cascode amplifier according to claim 4 wherein the first variable resistor comprises:
a second p-type field effect transistor, wherein the gate terminal of the second p-type field effect transistor receives the resistance adjusting signal , and the source terminal and the drain terminal of the second p-type field effect transistor are both terminals of the first variable resistor; and
a third p-type field effect transistor, wherein the source terminal of the third p-type field effect transistor is connected to the source terminal of the second p-type field effect transistor, and the drain terminal and the gate terminal of the third p-type field effect transistor are connected to the drain terminal of the second p-type field effect transistor.

8. The cascode amplifier according to claim 4 wherein the first variable resistor comprises:
a fourth p-type field effect transistor, wherein the gate terminal of the fourth p-type field effect transistor receives the resistance adjusting signal, and the source terminal and the drain terminal of the fourth p-type field effect transistor are both terminals of the first variable resistor; and
a polysilicon resistor having both terminals respectively connected to the source terminal and the drain terminal of the fourth p-type field effect transistor.

9. The cascode amplifier according to claim 4 wherein when the gain adjusting voltage is in a high gain-adjusting range, the resistance adjusting signal is adjusted but the current steering control signal is kept unchanged, wherein when the gain adjusting voltage is in a low gain-adjusting range, the current steering control signal is adjusted but the resistance adjusting signal is kept unchanged.

10. The cascode amplifier according to claim 9 wherein when the gain adjusting voltage is in the high gain-adjusting range, the resistances of the first variable resistor and the second variable resistor are adjusted according to the resistance adjusting signal, thereby decreasing a gain value of the cascode amplifier.

11. The cascode amplifier according to claim 9 wherein when the gain adjusting voltage is in the low gain-adjusting range, the trans-conductance parameters of the first n-type field effect transistor and the fourth n-type field effect transistor are decreased according to the current steering control signal, and the trans-conductance parameters of the second n-type field effect transistor and the third n-type field effect transistor are increased, so that the gain value of the cascode amplifier is decreased.

12. The cascode amplifier according to claim 9 wherein the gain control circuit comprises a controlling unit, a resistance adjusting circuit and a current steering control circuit, wherein when the gain adjusting voltage is in the high gain-adjusting range, the controlling unit controls the resistance adjusting signal to change the resistance adjusting signal, wherein when the gain adjusting voltage is in the low gain-adjusting range, the controlling unit controls the current steering control circuit to change the current steering control signal.

13. The cascode amplifier according to claim 12 wherein the resistance adjusting circuit comprises:
an operation amplifier;
a reference resistor interconnected between the voltage source and a first input terminal of the operation amplifier;
a first variable current source interconnected between the first input terminal of the operation amplifier and the ground terminal;
a fifth p-type field effect transistor, wherein the source terminal of the fifth p-type field effect transistor is connected to the voltage source, the gate terminal of the fifth p-type field effect transistor is connected to an output terminal of the operation amplifier, and the drain terminal of the fifth p-type field effect transistor is connected to a second input terminal of the operation amplifier; and
a second variable current source interconnected between the second input terminal of the operation amplifier and the ground terminal.

14. The cascode amplifier according to claim 13 wherein the current steering control circuit comprises:
a fifth n-type field effect transistor, wherein the drain terminal of the fifth n-type field effect transistor is connected to the voltage source, the gate terminal of the fifth n-type field effect transistor receives the gate voltage, and the source terminal of the fifth n-type field effect transistor is connected to a second node;
a sixth n-type field effect transistor, wherein the drain terminal and the gate terminal of the sixth n-type field effect transistor are connected to each other to generate the current steering control signal, and the source terminal of the sixth n-type field effect transistor is connected to the second node;
a third variable current source interconnected between the voltage source and the drain terminal of the sixth n-type field effect transistor; and
a fourth current source interconnected between the node and the ground terminal.

15. The cascode amplifier according to claim 14 wherein when the gain adjusting voltage is in the high gain-adjusting range, a current ratio between the first variable current source and the second variable current source is adjusted by the controlling unit, wherein when the gain adjusting voltage is in the low gain-adjusting range, the third variable current source is adjusted by the controlling unit.

* * * * *